(12) United States Patent
Watanabe et al.

(10) Patent No.: US 7,911,242 B2
(45) Date of Patent: Mar. 22, 2011

(54) SIGNAL GENERATING APPARATUS, TEST APPARATUS AND CIRCUIT DEVICE

(75) Inventors: Daisuke Watanabe, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 51 days.

(21) Appl. No.: 12/391,273

(22) Filed: Feb. 24, 2009

(65) Prior Publication Data

US 2010/0052736 A1 Mar. 4, 2010

Related U.S. Application Data

(63) Continuation of application No. PCT/JP2007/060783, filed on May 28, 2007.

(51) Int. Cl.
*H03B 21/00* (2006.01)

(52) U.S. Cl. .................. 327/107; 714/738; 714/740

(58) Field of Classification Search .............. 327/107; 714/738, 740, 744
See application file for complete search history.

(56) References Cited

U.S. PATENT DOCUMENTS

| | | | | |
|---|---|---|---|---|
| 4,534,028 A | * | 8/1985 | Trischler | 714/731 |
| 6,401,226 B1 | * | 6/2002 | Maeno | 714/728 |
| 6,972,603 B2 | * | 12/2005 | Mochizuki et al. | 327/155 |
| 2005/0081130 A1 | * | 4/2005 | Rinderknecht et al. | 714/726 |
| 2006/0116834 A1 | * | 6/2006 | Orisaka | 702/75 |
| 2008/0059091 A1 | * | 3/2008 | Watanabe et al. | 702/66 |

FOREIGN PATENT DOCUMENTS

| | | | |
|---|---|---|---|
| JP | 60-153214 | | 8/1985 |
| JP | 60153214 | * | 8/1985 |
| JP | 61-164319 | | 7/1986 |
| JP | 61-186012 | | 8/1986 |
| JP | 61186012 | * | 8/1986 |
| JP | 2002-40112 | | 2/2002 |

* cited by examiner

*Primary Examiner* — Lincoln Donovan
*Assistant Examiner* — Ryan C Jager
(74) *Attorney, Agent, or Firm* — Jianq Chyun IP Office

(57) ABSTRACT

There is provided a signal generating apparatus for generating an output signal corresponding to pattern data supplied thereto. The signal generating apparatus includes a timing generating section that generates a periodic signal, a shift register section including a plurality of flip-flops in a cascade arrangement through which each piece of data of the pattern data is propagated sequentially in response to the periodic signal, a waveform generating section that generates the output signal whose value varies in accordance with a cycle of the periodic signal, based on data values output from the plurality of flip-flops, and an analog circuit that enhances a predetermined frequency component in a waveform of the output signal generated by the waveform generating section.

17 Claims, 13 Drawing Sheets

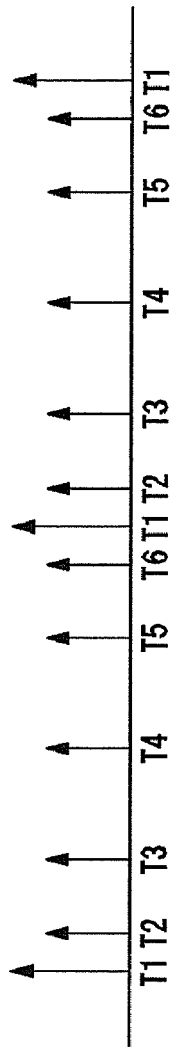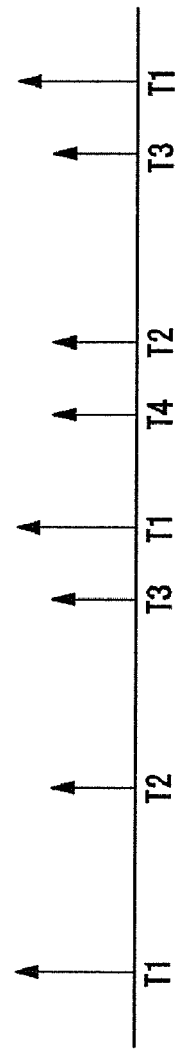
FIG. 3A
FIG. 3B

SIGNAL GENERATING APPARATUS, TEST APPARATUS AND CIRCUIT DEVICE

CROSS REFERENCE TO RELATED APPLICATION

This is a continuation application of PCT/JP2007/60783 filed on May 28, 2007 which claims priority from a Non-provisional patent application Ser. No. 11/509,307 filed on Aug. 24, 2006, the contents of which are incorporated herein by reference.

BACKGROUND

1. Technical Field

The present invention relates to a signal generating apparatus, a test apparatus and a circuit device. The present invention particularly relates to a signal generating apparatus that can freely correct the waveform of an output signal.

2. Related Art

A typical method of testing a device under test (DUT) such as a semiconductor circuit is to input a predetermined signal into the DUT, and measure an output signal from the DUT to judge whether the DUT is good or bad. For example, the signal input into the DUT has a predetermined logical pattern, and the output signal from the DUT is judged whether to have a logical pattern matching an expected value pattern so as to determine whether the DUT operates normally or not.

According to the above-described testing method, the test apparatus inputs the predetermined signal into the DUT. Here, this signal may attenuate while being transmitted on the path from the test apparatus to the DUT. If such attenuation occurs, the signal input into the DUT may have a different logical pattern from a logical pattern that is designated to be input into the DUT.

To solve this problem, the typical test apparatus has a function to correct the waveform of the test signal in advance based on the potential signal attenuation on the transmission path. For example, the test apparatus generates a plurality of pulse signals having different pulse widths based on the timing of the edge of the test signal, and adds the waveforms of these pulse signals to the waveform of the test signal. Thus, the test apparatus sharpens the edge portion of the test signal, for example, as disclosed in Japanese Patent Application Publication No. 2002-40112.

Here, such a typical test apparatus can sharpen the edge of the test signal, but cannot freely correct the waveform of the test signal. To be specific, since the test apparatus corrects the test signal by adding the pulse widths of the pulse signals generated based on the timing of the edge of the test signal, the test apparatus cannot make a correction to compensate a reflected wave and the like which may occur in a phase that is temporally distant from the edge, for example. In addition, the typical test apparatus can sharpen the edge, but cannot blunt the edge.

For the reasons stated above, the typical test apparatus cannot always test the DUT accurately. Furthermore, it has not been possible to test quantitatively a waveform equalizing function of the DUT when the device has a function of restoring an attenuated test signal, that is to say, a waveform equalizing circuit.

SUMMARY

Therefore, it is an object of an aspect of the innovations herein to provide a signal generating apparatus, a test apparatus, and a circuit device which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary signal generating apparatus may include a signal generating apparatus for generating an output signal corresponding to pattern data supplied thereto. The signal generating apparatus includes a timing generating section that generates a periodic signal, a shift register section including a plurality of flip-flops in a cascade arrangement through which each piece of data of the pattern data is propagated sequentially in response to the periodic signal, a waveform generating section that generates the output signal whose value varies in accordance with a cycle of the periodic signal, based on data values output from the plurality of flip-flops, and an analog circuit that enhances a predetermined frequency component in a waveform of the output signal generated by the waveform generating section.

According to the second aspect related to the innovations herein, one exemplary test apparatus may include a test apparatus for testing a device under test. The test apparatus includes a pattern generator that generates a test pattern to test the device, a signal generating apparatus that generates a test signal to be input into the device, based on the test pattern, and a judging section that judges whether the device is good or bad based on a signal output from the device. The signal generating apparatus includes a timing generating section that generates a periodic signal, a shift register section including a plurality of flip-flops in a cascade arrangement through which each piece of data of the test pattern is propagated sequentially in response to the periodic signal, a waveform generating section that generates the test signal whose value varies in accordance with a cycle of the periodic signal, based on data values output from the plurality of flip-flops, and an analog circuit that enhances a predetermined frequency component in a waveform of the test signal generated by the waveform generating section.

According to the third aspect related to the innovations herein, one exemplary circuit device may include a circuit device for outputting a signal having a desired waveform. The circuit device includes a pattern generator that generates a waveform pattern for the signal to be output from the circuit device, and a signal generating apparatus that generates the output signal based on the waveform pattern. The signal generating apparatus includes a timing generating section that generates a periodic signal, a shift register section including a plurality of flip-flops in a cascade arrangement through which each piece of data of the waveform pattern is propagated sequentially in response to the periodic signal, a waveform generating section that generates the output signal whose value varies in accordance with a cycle of the periodic signal, based on data values output from the plurality of flip-flops, and an analog circuit that enhances a predetermined frequency component in a waveform of the output signal generated by the waveform generating section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3A shows the edge timings of periodic signals as an example.

FIG. 3B shows the edge timings of periodic signals as an example

DESCRIPTION OF EXEMPLARY EMBODIMENT

Some aspects of the invention will now be described based on the embodiments, which do not intend to limit the scope of the present invention, but exemplify the invention. All of the features and the combinations thereof described in the embodiment are not necessarily essential to the invention.

Figure 1:
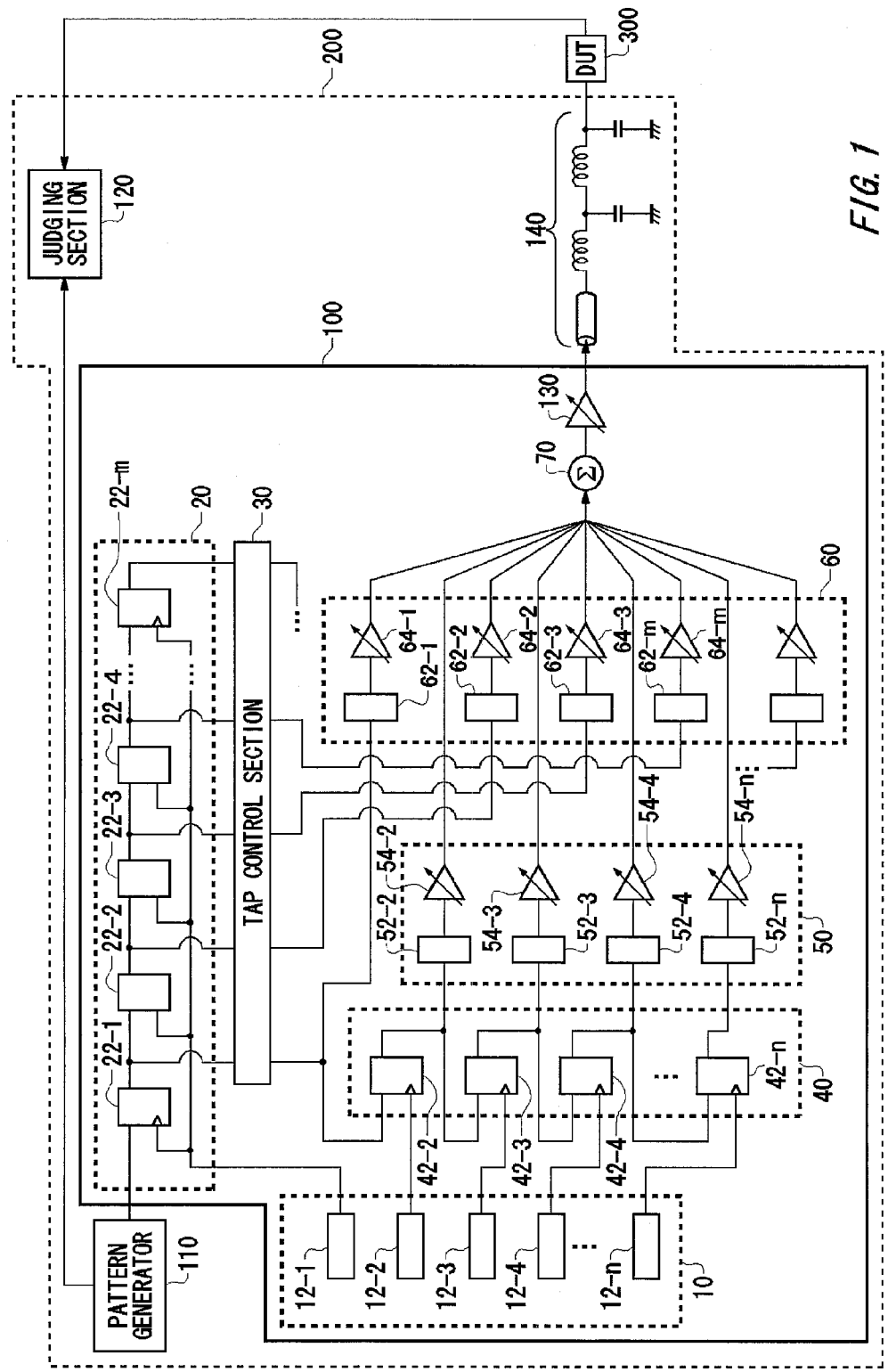
FIG. 1 shows an example of a configuration of a test apparatus 200 relating to an embodiment of the invention.

FIG. 1 shows an example of the configuration of a test apparatus 200 relating to an embodiment of the invention. The test apparatus 200 tests a device under test (DUT) 300, which is a semiconductor circuit for example. For example, the test apparatus 200 inputs a signal having a predetermined logical pattern into the DUT 300, and compares the logical pattern of a signal output from the DUT 300 with an expected value pattern, to determine whether the DUT 300 is good or bad. The test apparatus 200 relating to the embodiment includes a signal generating apparatus 100, a pattern generator 110, a judging section 120, and a transmission path 140.

The pattern generator 110 generates a test pattern to test the DUT 300. For example, the pattern generator 110 generates a test pattern including a logical pattern (pattern data) that should be included in a signal to be input into the DUT 300.

The signal generating apparatus 100 generates a test signal to be input into the DUT 300, on the basis of the test pattern generated by the pattern generator 110. For example, the signal generating apparatus 100 generates a test signal indicating a level corresponding to the pattern data included in the test pattern. In addition, the signal generating apparatus 100 corrects the waveform of the test signal in advance. The configuration and operation of the signal generating apparatus 100 will be later described in detail.

The transmission path 140 transmits the test signal output from the amplifier 130 to an input terminal of the DUT 300. The transmission path 140 may be a wiring such as a cable. The transmission path 140 may cause a predetermined degree of attenuation or a predetermined reflected wave, in the test signal.

The judging section 120 judges whether the DUT 300 is good or bad based on a signal output from the DUT 300. For example, the judging section 120 may make such judgment by comparing the logical pattern of the output signal with an expected value pattern supplied from the pattern generator 110. Here, the pattern generator 110 generates the expected value pattern based on the test pattern.

The signal generating apparatus 100 includes a timing generating section 10, a shift register section 20, a register section 40, and a waveform generating section. In this embodiment, the waveform generating section includes a first calculating section 50, a second calculating section 60, an output section 70, and an amplifier 130.

The timing generating section 10 includes a plurality of timing generators (12-1 to 12-n, hereinafter collectively referred to as timing generators 12) that use a supplied reference clock to generate a plurality of periodic signals each having a different phase with respect to the reference clock. In other words, the timing generators 12 generate periodic signals that all have substantially the same cycle but each have a different phase. Each of the timing generators 12 may be a PLL circuit. Alternatively, one of the timing generators 12 which is designated as a reference circuit may be a PLL circuit and the rest may be delay circuits. If this is the case, the reference timing generator 12 generates a first periodic signal, which then branches to be received by the rest of the timing generators 12. Each of the rest of the timing generators 12 may delay the received first periodic signal by a different delay amount.

The shift register section 20 includes a plurality of flip-flops in a cascade arrangement (22-1 to 22-m, hereinafter collectively referred to as flip-flops 22). Through the flip-flops 22, each piece of data of the pattern data output from the pattern generator 110 is propagated sequentially. Each of the flip-flops 22 receives the first periodic signal which is output from a first timing generator 12-1 as a clock frequency, and propagates each piece of data of the pattern data to the next-stage flip-flop 22 in response to the first periodic signal.

The second calculating section 60 includes a plurality of sign control circuits (62-1 to 62-m, hereinafter collectively referred to as sign control circuits 62) and a plurality of calculating circuits (64-1 to 64-m, hereinafter collectively referred to as calculating circuits 64), provided in a one-to-one correspondence with the flip-flops 22. Each of the sign control circuits 62 determines the sign of a data value output from a corresponding one of the flip-flops 22. To be specific, each sign control circuit 62 selects a positive or negative sign for the data value output from the corresponding flip-flop 22, and then outputs the data value. Here, a user may designate, in advance, which one of positive and negative signs is to be selected by each of the sign control circuits 62. While the signal generating apparatus 100 is operating, the sign selected by each of the sign control circuits 62 may or may not be varied.

Each of the calculating circuits 64 receives a data value output from a corresponding one of the flip-flops 22 via a corresponding one of the sign control circuits 62. Each calculating circuit 64 multiplies the received data value by a predetermined coefficient, and outputs a signal indicating a level set in accordance with the multiplication result. Each calculating circuit 64 may be an amplifier having an amplification ratio corresponding to the coefficient. While the signal generating apparatus 100 is operating, the coefficient of each calculating circuit 64 may or may not be varied.

The output section 70 adds together the waveforms of the signals output from the calculating circuits 64, and outputs the result of the addition. The amplifier 130 amplifies the test signal generated by the output section 70 at a predetermined amplification ratio, and outputs the amplified test signal.

Also, the amplifier 130 may output the test signal by setting a predetermined signal level as a reference level. For example, the amplifier 130 may amplify the test signal at a predetermined amplification ratio, add a predetermined offset voltage to the test signal, and output the resulting test signal. With the above-described configuration, the signal generating apparatus 100 can correct the waveform of the output signal based on the edge of the first periodic signal by using the pattern data.

The register section 40 includes a plurality of registers (42-2 to 42-$n$, hereinafter collectively referred to as registers 42) provided in a one-to-one correspondence with the timing generators 12-2 to 12-$n$ which do not include the first timing generator 12-1. The registers 42 are in a cascade arrangement, that is to say, output data from each of the registers 42 is input into the next-stage register 42. Each of the registers 42 receives the input data in response to a periodic signal output from a corresponding one of the timing generators 12, and outputs the received data. In this embodiment of the invention, the first-stage register 42 receives data output from a pre-selected one of the flip-flops 22. The data is propagated sequentially in response to the periodic signals output from the timing generators 12.

The first calculating section 50 includes a plurality of sign control circuits (52-2 to 52-$n$, hereinafter collectively referred to as sign control circuits 52) and a plurality of calculating circuits (54-2 to 54-$n$, hereinafter collectively referred to as calculating circuits 54), provided in a one-to-one correspondence with the registers 42. Each of the sign control circuits 52 determines the sign of a data value output from a corresponding one of the registers 42. To be specific, each sign control circuit 52 selects a positive or negative sign for the data value output from the corresponding register 42, and then outputs the data value. Here, the user may designate, in advance, which one of positive and negative signs is to be selected by each of the sign control circuits 52. While the signal generating apparatus 100 is operating, the sign selected by each of the sign control circuits 52 may or may not be varied.

Each of the calculating circuits 54 receives a data value output from a corresponding one of the registers 42 via a corresponding one of the sign control circuits 52. Each calculating circuit 54 multiplies the received data value by a predetermined coefficient, and outputs a signal indicating a level set in accordance with the multiplication result. Each calculating circuit 54 may be an amplifier having an amplification ratio corresponding to the coefficient. While the signal generating apparatus 100 is operating, the coefficient of each calculating circuit 54 may or may not be varied.

The output section 70 adds together the waveforms of the signals output from the calculating circuits 54, and outputs the result of the addition. In other words, the output section 70 outputs a signal indicating a result of adding together the waveforms of the signals output from the calculating circuits 54 and 64. With the above-described configuration, the signal generating apparatus 100 can correct the waveform of the output signal based on a timing other than the first periodic signal.

The user may freely set the phase of the periodic signal output from each of the timing generators 12, with respect to the first periodic signal. With this configuration, the signal generating apparatus 100 can correct the waveform of the output signal based on a desired timing. For example, the signal generating apparatus 100 can generate a waveform corresponding to the signal edge of the output signal (the edge timing of the first periodic signal) in a phase (the edge timing of a different periodic signal) which is temporally distant from the signal edge. Therefore, the signal generating apparatus 100 can generate, in advance, in the output signal, a waveform to offset a reflected wave which may occur on the transmission path 140. Thus, the signal generating apparatus 100 can accurately input a desired signal into the DUT 300.

A tap control section 30 selects one of the data values output from the flip-flops 22, and inputs the selected data value into the first-stage register 42. Having this configuration, the signal generating apparatus 100 can select which one of the data values output from the flip-flops 22 is to be used as a reference to correct the waveform of the output signal. The user may designate in advance which one of the flip-flops 22 is to be selected by the tap control section 30.

Also, the tap control section 30 is configured to input the data value output from each of the flip-flops 22 into a corresponding one of the sign control circuits 62. The user may designate in advance how the flip-flops 22 and sign control circuits 62 are related to each other. While the signal generating apparatus 100 is operating, the settings for the tap control section 30 may not be changed.

Figure 2:
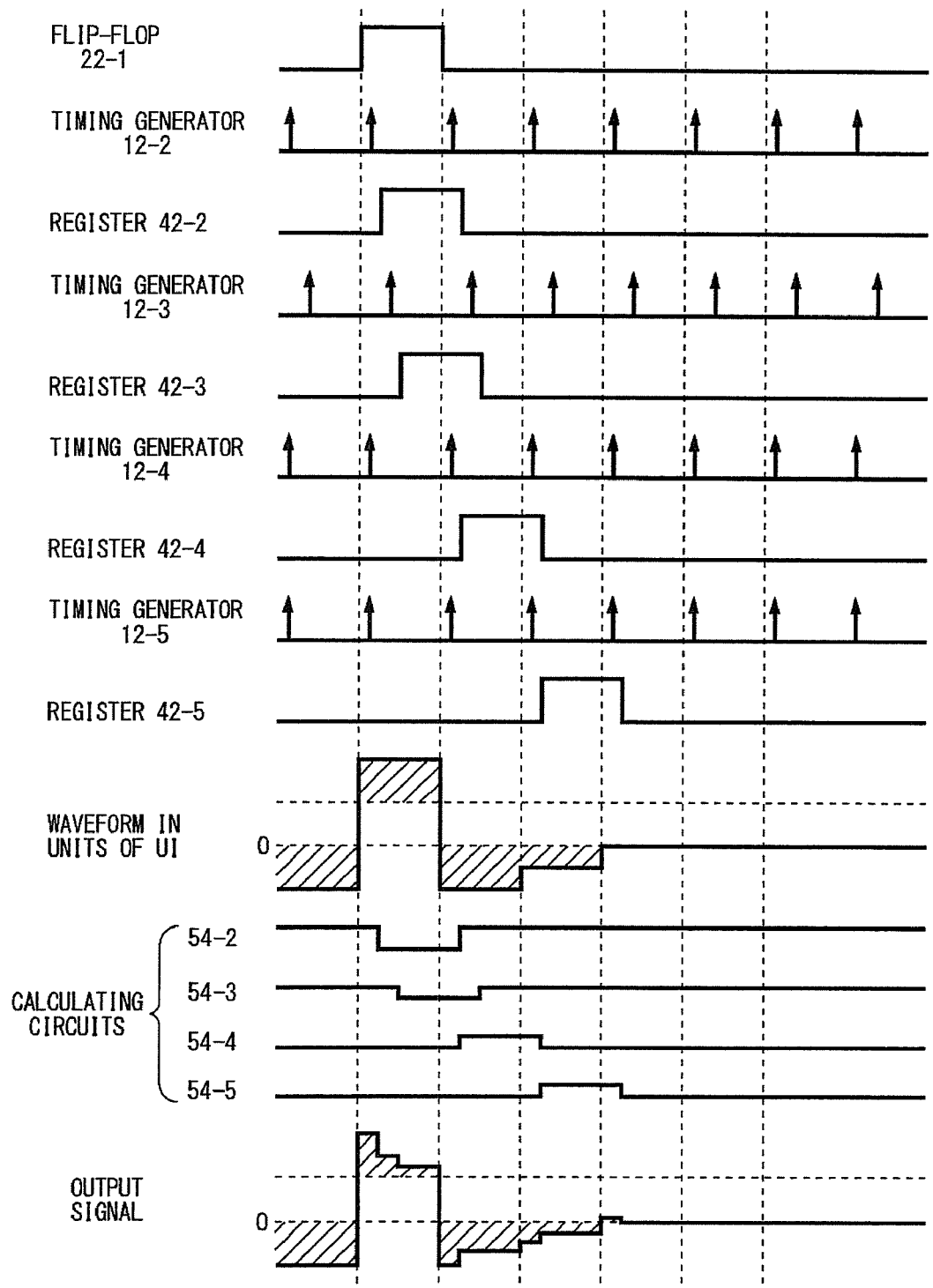
FIG. 2 is a timing chart showing an operation performed by a signal generating apparatus 100 as an example.

FIG. 2 is a timing chart showing the operation performed by the signal generating apparatus 100 as an example. FIG. 2 is mainly used to explain the waveform correction performed by the first calculating section 50. In this embodiment, the number of timing generators 12 is set to five, and the tap control section 30 selects the data output from the flip-flop 22-1, and inputs the selected data into the first-stage register 42-2.

The flip-flop 22-1 propagates the data value output from the pattern generator 110 in response to the first periodic signal. As shown in FIG. 2, when the flip-flop 22-1 outputs a data value "1", the register 42-2 receives the data value "1" in response to a second periodic signal output from the corresponding timing generator 12-2, and outputs the received data value. In a similar manner, each of the subsequent-stage registers 42 receives the data value output from the previous-stage register 42 in response to a periodic signal output from a corresponding one of the timing generators 12, and outputs the received data value.

Each of the calculating circuits 54 outputs a signal generated based on the data value output from a corresponding one of the registers 42 as shown in FIG. 2. As described above, each calculating circuit 54 multiplies the data value output from the corresponding register 42 by a predetermined coefficient, and outputs a signal indicating a level set in accordance with the multiplication result. Each of the sign control circuits 52 selects the sign for the signal output from a corresponding one of the calculating circuits 54.

The output section 70 adds together the waveforms of the signals output from the calculating circuits 54, to correct the waveform of the output signal. To this calculation, the output section 70 also adds a waveform in units of unit interval (UI) which is generated by the second calculating section 60. This waveform can be generated by using a typical method, which is therefore not illustrated herein. Here, the UI may indicate the duration of one bit in the test signal.

Referring to FIG. 2, the shaded regions are the regions corrected by the first and second calculating sections 50 and 60. As shown in FIG. 2, the signal generating apparatus 100 can correct the waveform of the output signal by using a plurality of periodic signals having different phases, thereby realizing highly variable waveform correction.

As described above, the signal generating apparatus 100 relating to the present embodiment can perform waveform correction, by using the pattern data to generate the output signal, in units of UI of the output signal and based on a desired timing. Having such a configuration, the embodiment can accurately correct the waveform of the output signal, thereby enabling the test apparatus 200 to accurately test the DUT 300.

FIGS. 3A and 3B each show the edge timings of the periodic signals as an example. The timing generating section 10 may output the periodic signals in such a manner that the edge timings of the periodic signals excluding the first periodic signal are more densely distributed in the vicinity of the edge timing of the first periodic signal, as shown in FIG. 3A. With this configuration, the signal generating apparatus 100 can correct a portion of the waveform of the output signal which is in the vicinity of the signal edge in a finer manner.

Alternatively, the timing generating section 10 may output the periodic signals in such a manner that a difference in phase between a periodic signal output from one of the timing generators 12 and the first periodic signal is set larger than the UI (the UI of the first periodic signal), as shown in FIG. 3B. With this configuration, the signal generating apparatus 100 can generate a waveform to offset a reflected wave that may occur in a phase temporally distant from a pulse of the output signal by a time equal to the UI or longer, for example. Here, the cycle of each periodic signal may be substantially equal to the cycle of the test signal (the UI).

Figure 4:
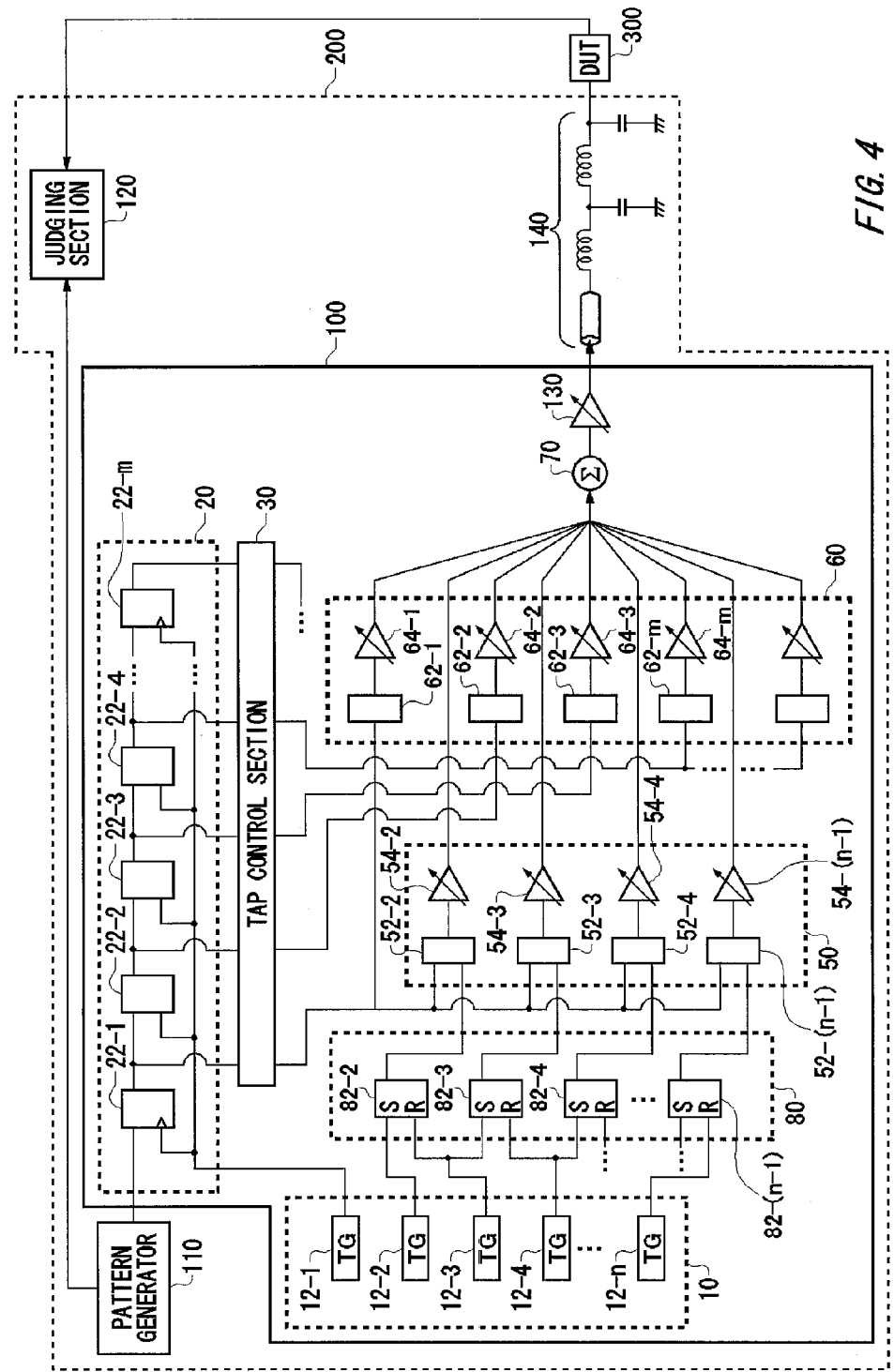
FIG. 4 shows another example of the configuration of the signal generating apparatus 100.

FIG. 4 shows another example of the configuration of the signal generating apparatus 100. The signal generating apparatus 100 relating to this embodiment is different in that the register section 40 is replaced with a set-reset latch section 80. The other constituents indicated by the same reference numerals as in FIG. 1 have the same or similar functions and configurations as/to the corresponding constituents of the previous embodiment.

The set-reset latch section 80 includes a plurality of set-reset latches (82-2 to 82-($n$-1), hereinafter collectively referred to as set-reset latches 82) in a one-to-one correspondence with the timing generators (12-2 to 12-($n$-1)), which do not include the first timing generator 12-1 and the last-stage timing generator 12-$n$. Each of the set-reset latches 82 receives a periodic signal from a corresponding one of the timing generators 12 and a periodic signal from the next-stage timing generator 12. Here, the next-stage timing generator 12 may output a periodic signal having a phase delayed by the smallest amount with respect to the phase of the periodic signal output from the corresponding timing generator 12.

Each set-reset latch 82 maintains the output of a signal indicating a logical value "1" during a time period defined by the edge of the periodic signal received from the corresponding timing generator 12 and the edge of the periodic signal received from the next-stage timing generator 12. The tap control section 30 inputs the data value output from a selected one of the flip-flops 22 into each of the sign control circuits 52. Each sign control circuit 52 selects a sign for the received data value and outputs the data value, when a corresponding one of the set-reset latches 82 outputs the logical value "1".

According to this embodiment, the signal generating apparatus 100 can correct the waveform of the output signal at a desired timing based on the edge of each of the periodic signals, and by using a desired pulse width based on the difference in phase between the periodic signals. With this configuration, the signal generating apparatus 100 can perform very fine waveform correction, for example, by reducing the difference in phase between the periodic signals output from adjacent two of the timing generators 12.

Figure 5:
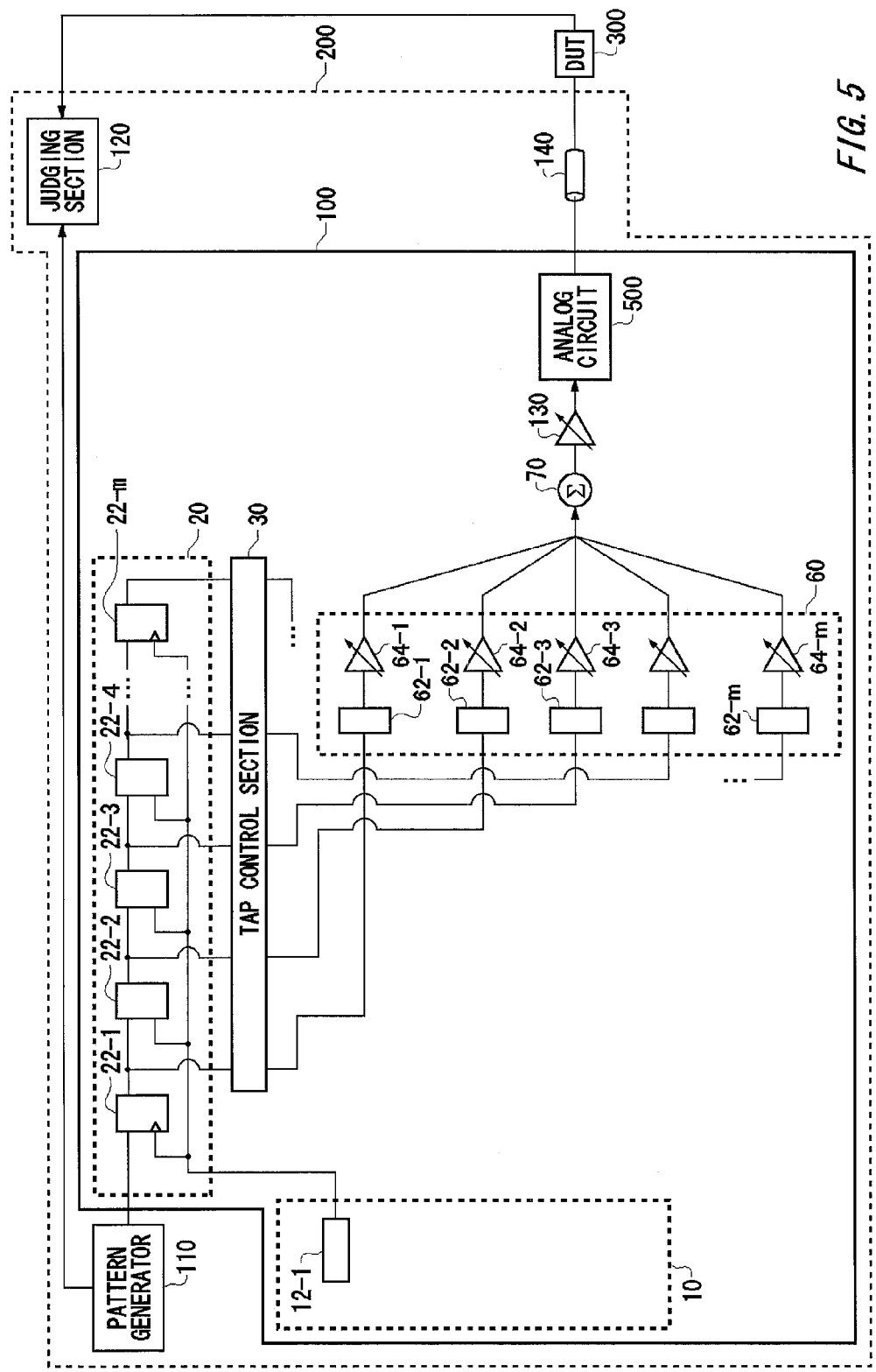
FIG. 5 shows another example of the configuration of the signal generating apparatus 100.

FIG. 5 shows another example of the configuration of the signal generating apparatus 100. The signal generating apparatus 100 relating to the present example enhances a predetermined frequency component of a discrete waveform formed by combining rectangular waves, for example the waveform shown in FIG. 2, to generate a continuous waveform. For example, the signal generating apparatus 100 may enhance the waveform in units of the UI shown in FIG. 2 or a predetermined frequency component of the output signal. In the latter case, an analog circuit 500 may be added to the configuration of the signal generating apparatus 100 shown in FIG. 1 or 4 as a following stage of the amplifier 130, for example. The analog circuit 500 enhances a predetermined frequency component of the output waveform from the amplifier 130. The analog circuit 500 may be an analog peaking circuit that enhances a predetermined high frequency component, for example. The analog circuit 500 may be a circuit that enhances a high frequency component of an input waveform by superposing a differential waveform of the input waveform onto the input waveform, for example. Alternatively, the analog circuit 500 may be a circuit that smoothes an input waveform. With the above configuration, the signal generating apparatus 100 can change a discrete waveform of the output signal shown in FIG. 2 into a continuous waveform in which a predetermined frequency component is enhanced.

FIG. 5 illustrates an exemplary configuration of the signal generating apparatus 100 that is utilized when the waveform in units of the UI, shown in FIG. 2, is enhanced. The signal generating apparatus 100 relating to the present example is different in configuration from the signal generating apparatus 100 described with reference to FIG. 1 in terms of that the register section 40 and the first calculating section 50 are omitted and the analog circuit 500 is added. Furthermore, according to the present example, the timing generating section 10 is different in terms of having a single timing generator 12-1. Except for these differences, the remaining constituents may be the same as the corresponding constituents shown in FIG. 1 that are assigned the same reference numerals.

In the shift register section 20, each piece of data of the pattern data is propagated sequentially through the flip-flops 22 in accordance with a periodic signal generated by the timing generator 12-1. For example, the timing generator 12-1 may generate a periodic signal whose cycle is substantially the same as the cycle of the test signal to be generated by the signal generating apparatus 100 (the UI). The tap control section 30 may have the same functions and configuration as the tap control section 30 described with reference to FIGS. 1 to 4.

According to the present example, a waveform generating section includes the second calculating section 60, the output section 70, and the amplifier 130. The waveform generating section generates an output signal whose value varies at an interval equal to the cycle of the periodic signal generated by the timing generator 12-1, based on the data values output from the flip-flops 22 of the shift register section 20. Since the signal generating apparatus 100 relating to the present example does not include the register section 40 and the first calculating section 50, the waveform of the output signal output from the amplifier 130 is equivalent to the waveform in units of the UI, for example, shown in FIG. 2.

The analog circuit 500 enhances a predetermined frequency component of the waveform of the output signal generated by the amplifier 130 of the waveform generating section, and inputs the resulting signal into the DUT 300 via the transmission path 140. For example, the analog circuit 500 may be an analog peaking circuit that enhances a predetermined high frequency component, to enhance the edge portion of the output signal. For example, the analog circuit 500 may be configured, as later described with reference to FIG. 10, in such a manner that an RC high pass filter is provided in parallel with a transmission line and the signals from the RC high pass filter and the transmission line are combined together. With such a configuration, the analog circuit 500 may generate a waveform in which a predetermined high frequency component is enhanced. The time constant of the analog circuit 500 may be defined in accordance with the time constant of the transmission path 140, which is measured in advance.

Figure 6:
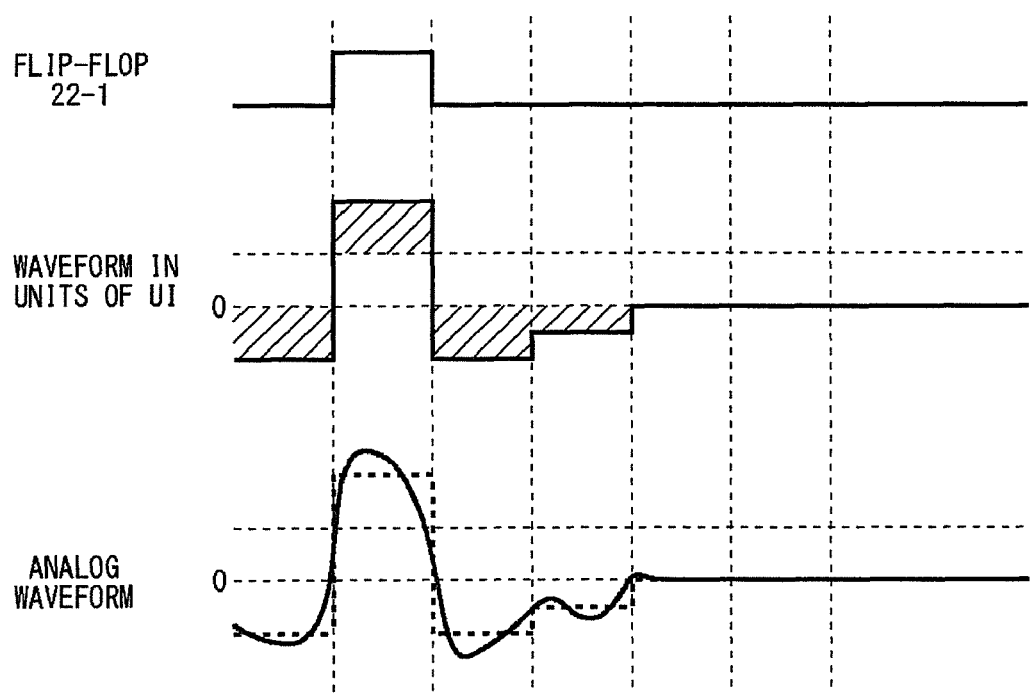
FIG. 6 illustrates an example of an analog waveform output from an analog circuit 500.

FIG. 6 illustrates an example of an analog waveform output from the analog circuit 500. As described above, the analog circuit 500 receives a discrete waveform in units of the UI and generates an analog waveform in which a high frequency component of the received waveform is enhanced. The signal generating apparatus 100 relating to the present example can generate a test signal whose value varies at the interval smaller than the UI, as shown in FIG. 6, with a simple configuration illustrated in FIG. 5.

Figure 7:
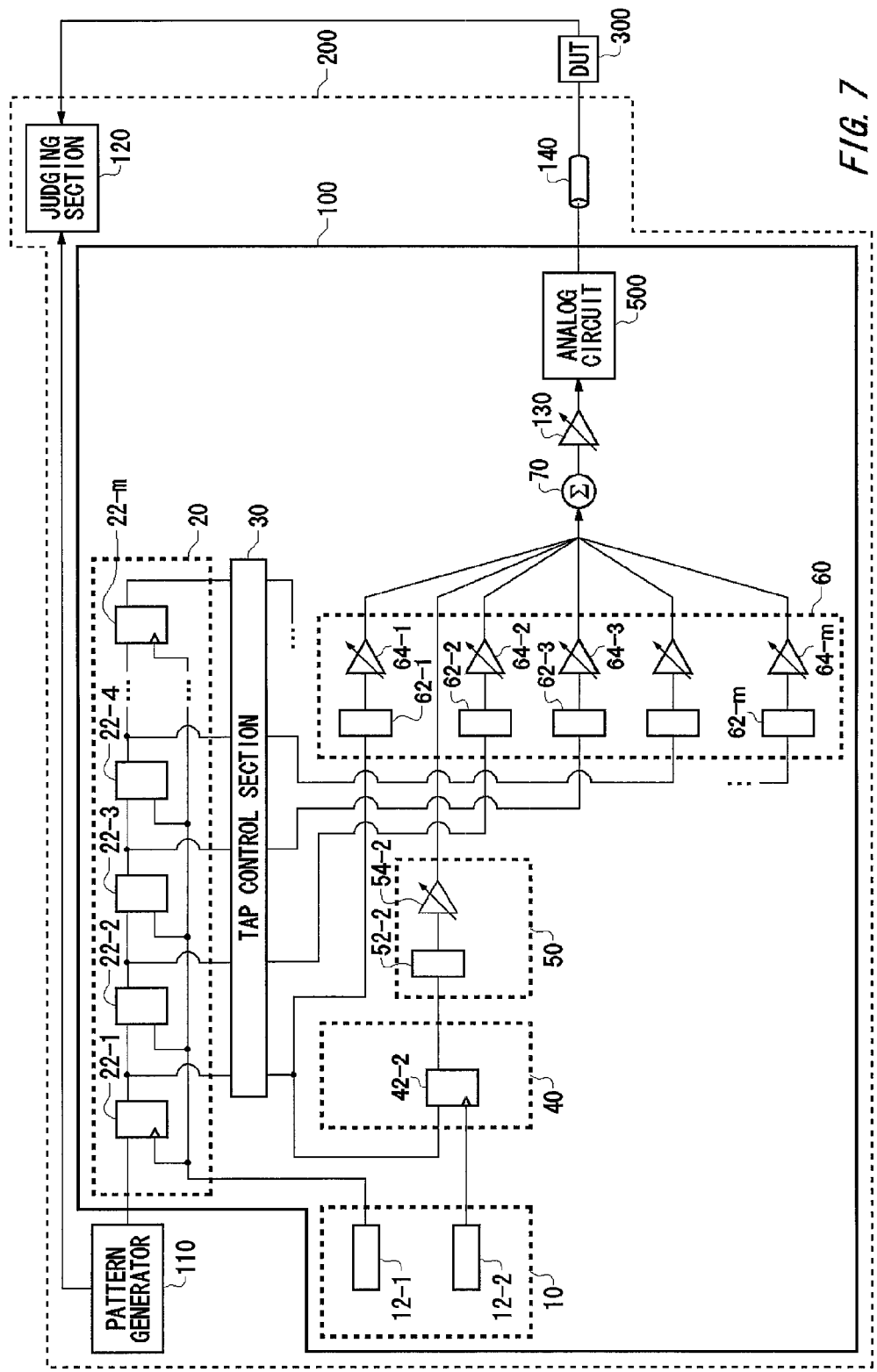
FIG. 7 illustrates another example of the configuration of the signal generating apparatus 100.

FIG. 7 illustrates another example of the configuration of the signal generating apparatus 100. The signal generating apparatus 100 relating to the present example is obtained by adding an analog circuit 500 to the signal generating apparatus 100 having the configuration shown in FIG. 1. According to the present example, the timing generating section 10 includes a first timing generator 12-1 and a second timing generator 12-2, the register section 40 includes one register 42-2, and the first calculating section 50 includes one sign control circuit 52-2 and one calculating circuit 54-2. Except for these differences, the remaining constituents may have the same functions and configurations as the corresponding constituents shown in FIG. 1 that are assigned the same reference numerals.

The second timing generator 12-2 may generate a second periodic signal that has a phase different from the phase of a first periodic signal generated by the first timing generator 12-1. The second periodic signal may have substantially the same cycle as the first periodic signal. The register 42-2 sequentially acquires the data output from one of the flip-flops 22 that is selected in advance by the tap control section 30, in accordance with the second periodic signal supplied from the second timing generator 12-2, and outputs the acquired data.

The waveform generating section according to the present example includes the first calculating section 50, the second calculating section 60, the output section 70, and the amplifier 130. The waveform generating section generates an output signal whose value varies in accordance with the phases of the first and second periodic signals, based on the data values output from the flip-flops 22 and the register 24.

Specifically speaking, the sign control circuit 52-2 and the calculating circuit 54-2 in the first calculating section 50 generate a waveform whose value varies in accordance with the phase of the second periodic signal, based on the data value output from the register 24. Also, the second calculating section 60 generates a waveform whose value varies in accordance with the phase of the first periodic signal, based on the data values output from the flip-flops 22. The output section 70 then combines the waveforms output from the first and second calculating sections 50 and 60, thereby generating an output signal whose value varies in accordance with the phases of the first and second periodic signals.

The amplifier 130 and the analog circuit 500 may have the same functions and configurations as the amplifier 130 and the analog circuit 500 described with reference to FIG. 5. With such a configuration, the signal generating apparatus 100 relating to the present example can compensate the waveform of the test signal more accurately. For example, the signal generating apparatus 100 can generate a waveform that has been corrected to compensate a reflected wave or the like that may occur at a given timing different from the edge of the first periodic signal.

In this case, the tap control section 30 may select one of the flip-flops 22 that is to be connected to the register 42-2, depending on a unit interval in which reflection of a rectangular wave in a certain unit interval may occur. The selection of one of the flip-flops 22 made by the tap control section 30 can lead to selection of a unit interval in which a reflected-wave compensating waveform is generated. Furthermore, a phase in the selected unit interval at which the reflected-wave compensating waveform is generated can be adjusted in accordance with the phase of the second periodic signal generated by the second timing generator 12-2. The second timing generator 12-2 may generate the second periodic signal having a phase difference, with respect to the first periodic signal, that is determined in accordance with the phase at which the reflected-wave compensating waveform is to be generated.

Figure 8:
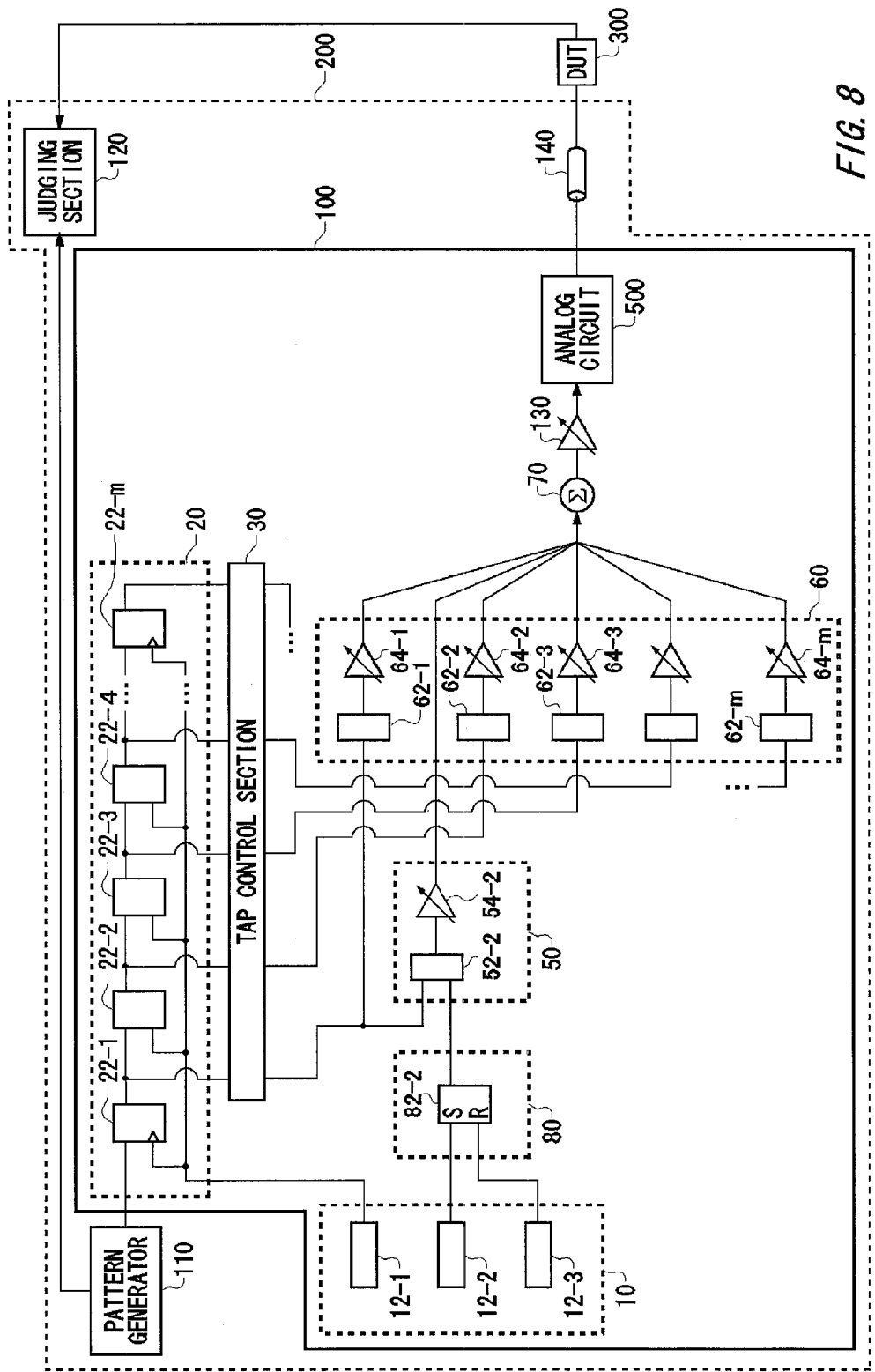
FIG. 8 illustrates another example of the configuration of the signal generating apparatus 100.

FIG. 8 illustrates another example of the configuration of the signal generating apparatus 100. The signal generating apparatus 100 relating to the present example is obtained by replacing the register section 40 in the signal generating apparatus 100 shown in FIG. 7 with a set-reset latch section 80. The set-reset latch section 80 has one set-reset latch 82, which is described with reference to FIG. 4. The timing generating section 10 further includes a third timing generator 12-3. Except for these differences, the remaining constituents may have the same functions and configurations as the corresponding constituents shown in FIG. 7 that are assigned the same reference numerals.

The third timing generator 12-3 generates a third periodic signal. The third periodic signal may have a phase different from the phase of the second periodic signal. The set-reset latch 82 receives the second and third periodic signals, and outputs a pulse whose width is determined in accordance with the phase difference between the second periodic signal and the third periodic signal, as described with reference to FIG. 4.

The sign control circuit 52-2 determines the sign of the logic value supplied from the tap control section 30 and outputs the logic value with the determined sign during a time period for which the signal received from the set-reset latch 82 indicates the H logic, as described with reference to FIG. 4. The processing performed by the calculating circuit 54 and the subsequent constituents may be the same as in the signal generating apparatus 100 described with reference to FIG. 7.

Having the above-described configuration, the signal generating apparatus 100 relating to the present example can generate a waveform that is corrected to compensate a reflected wave or the like and that has a pulse width different from the cycles of the respective periodic signals. In other words, the signal generating apparatus 100 can generate a waveform that is corrected to compensate a reflected wave or the like and that has a desired pulse width, by adjusting the phase difference between the second periodic signal and the third periodic signal.

Figure 9:
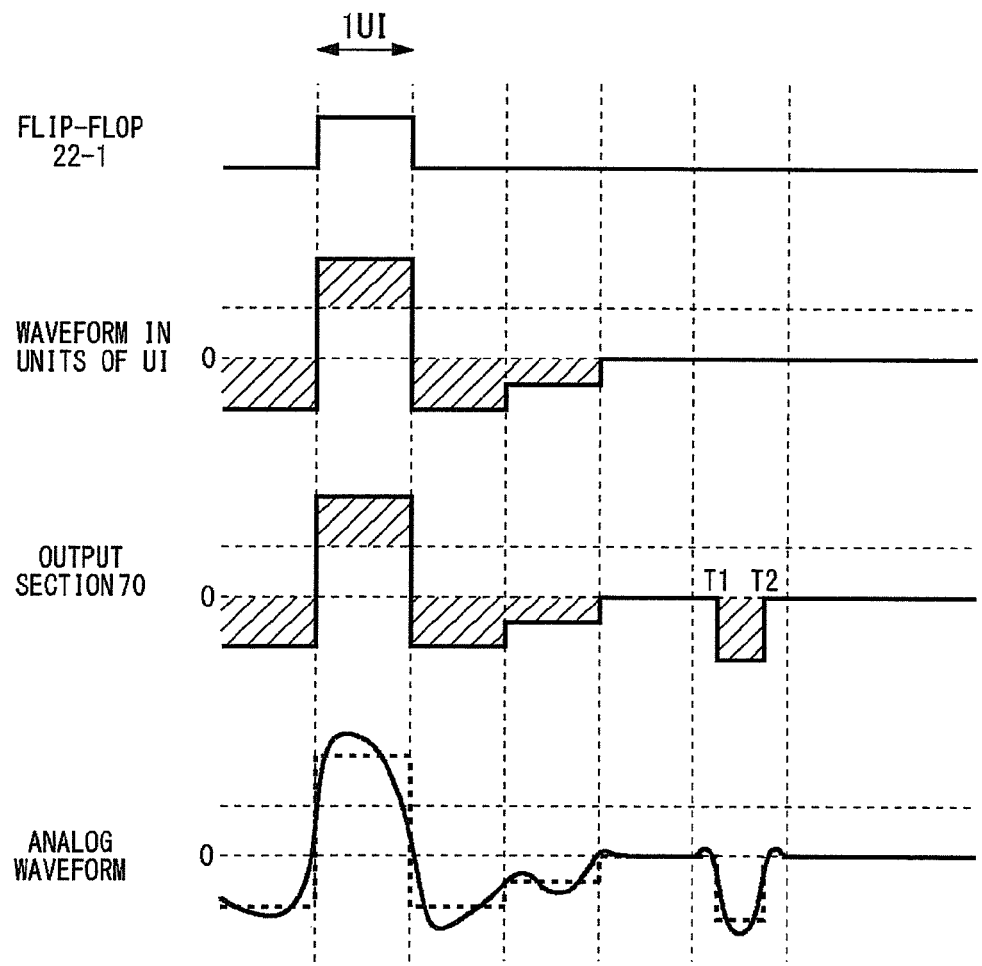
FIG. 9 illustrates an exemplary operation of the signal generating apparatus 100 illustrated in FIG. 8.

FIG. 9 illustrates an exemplary operation of the signal generating apparatus 100 illustrated in FIG. 8. In FIG. 9, a referential mark T1 indicates the phase of the first periodic signal and a referential mark T2 indicates the phase of the second periodic signal, for example. As described above, the signal generating apparatus 100 can generate a waveform in which a pulse with a desired pulse width is positioned at a desired position, by adjusting the phases of the first and second periodic signals. As a result, the signal generating apparatus 100 can compensate a reflected wave or the like that has any pulse width and occurs at any position.

Figure 10:
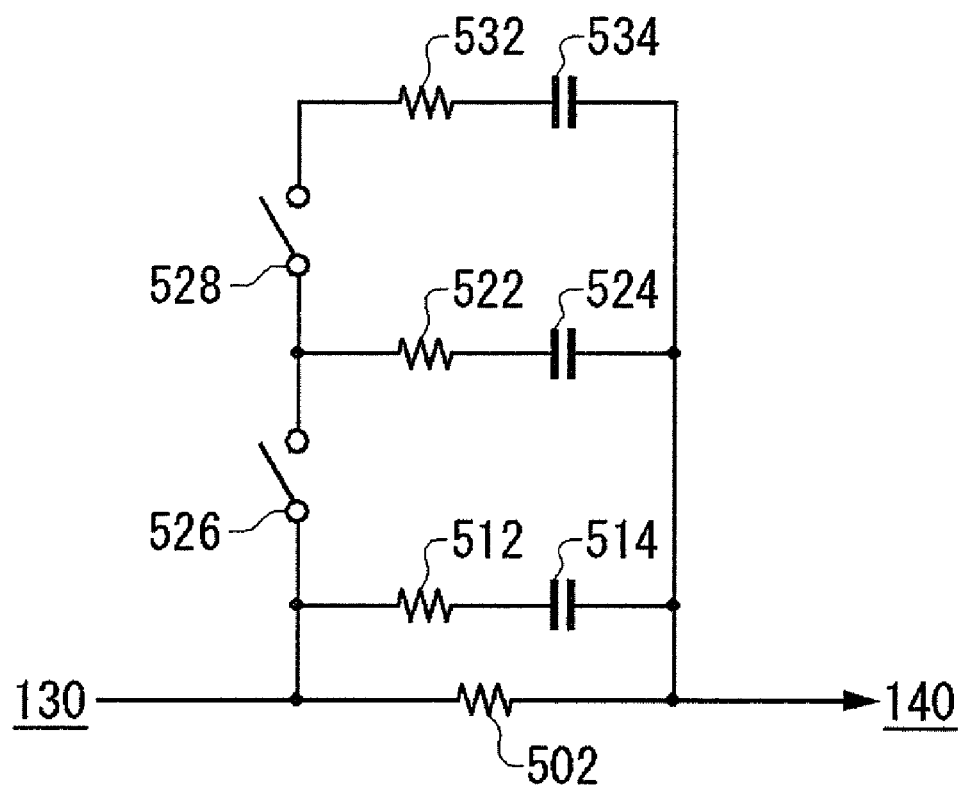
FIG. 10 illustrates an exemplary configuration of the analog circuit 500.

FIG. 10 illustrates an exemplary configuration of the analog circuit 500. According to the present example, the analog circuit 500 includes a plurality of resistances 502, 512, 522 and 532, a plurality of capacitors 514, 524, and 534, and a plurality of switches 526 and 528. The resistances 502, 512, 522 and 532 are provided in parallel with each other. The capacitors 514, 524 and 534 are provided in a one-to-one correspondence with the resistances 512, 522, and 532, excluding the resistance 502 on a transmission path, and respectively connected in series with the corresponding resistances 512, 522 and 532. The switch 526 switches whether or not to connect the resistances and capacitors of the second and subsequent stages in parallel to the resistance 502 on the transmission path.

For example, when the switch 526 is off, the analog circuit 500 generates a waveform by superposing a signal that has passed through a first-order CR high pass FIR filter onto an original signal. On the other hand, when all of the switches are on, the analog circuit 500 generates a waveform by superposing a signal that has passed through a third-order CR high pass FIR filter onto an original signal. The constants of the respective resistances and the respective capacitors may be adjustable in accordance with a desired time constant. With the above-described configuration, the analog circuit 500 can generate a waveform in which a predetermined high frequency component of an input signal is enhanced. It should be noted, however, that the configuration of the analog circuit 500 is not limited to the configuration shown in FIG. 10. The analog circuit 500 can be configured by using a known high-frequency component enhancing circuit.

Figure 11:
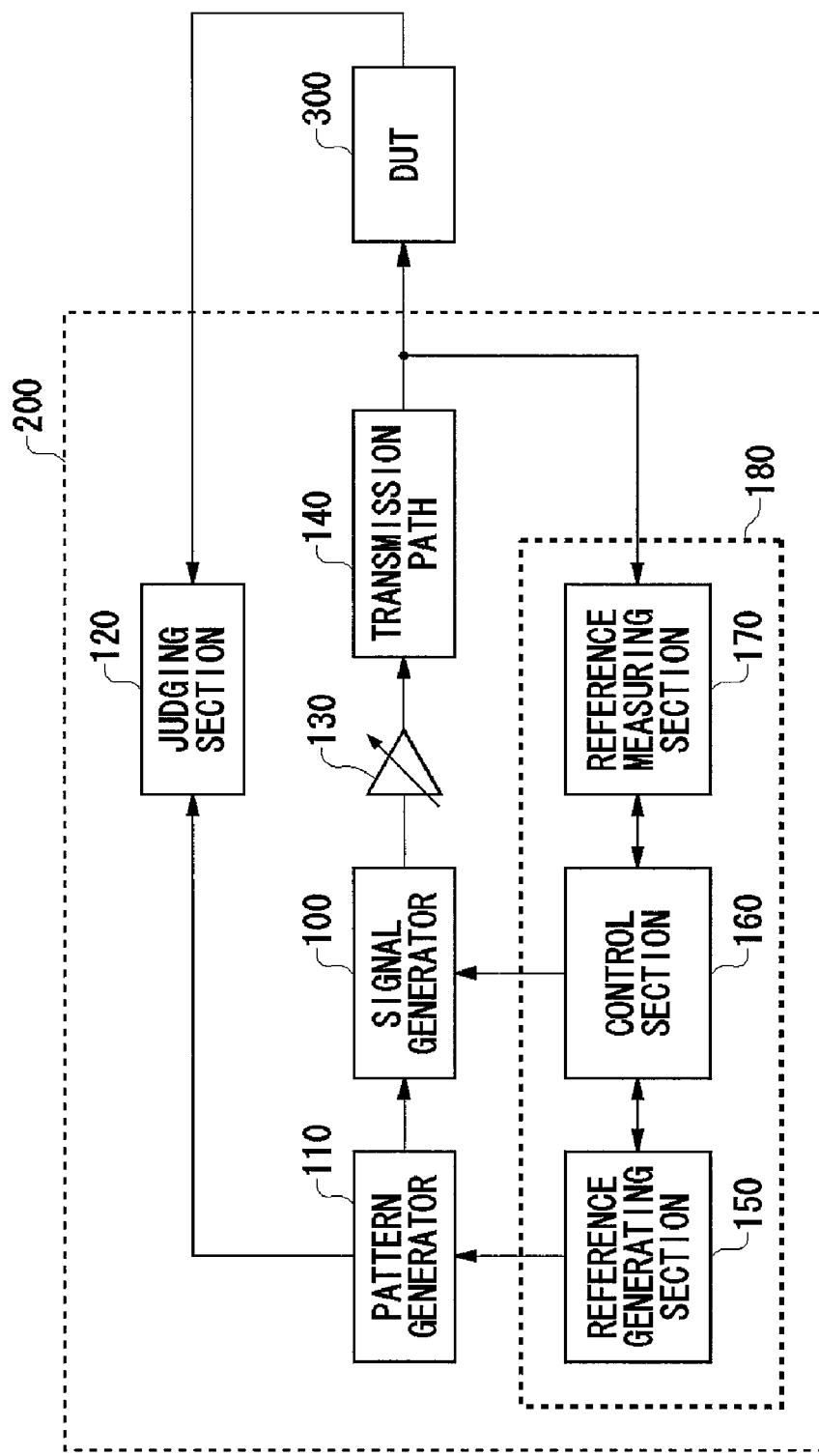
FIG. 11 shows another example of the configuration of the test apparatus 200.

FIG. 11 shows another example of the configuration of the test apparatus 200. According to this embodiment, the test apparatus 200 includes a calibrating section 180 in addition to the constituents shown in FIGS. 1 to 10. The other constituents indicated by the same reference numerals as in FIGS. 1 to 10 may have the same or similar functions and configurations as the corresponding constituents in the previous embodiment.

The calibrating section 180 calibrates the signal generating apparatus 100 before the test apparatus 200 tests the DUT 300. The calibrating section 180 includes a reference generating section 150, a control section 160, and a reference measuring section 170.

The reference generating section 150 causes the signal generating apparatus 100 to output a reference signal having a predetermined waveform. In this embodiment, the reference generating section 150 causes the pattern generator 110 to output predetermined pattern data.

The reference measuring section 170 measures the waveform of the reference signal at a point when the reference signal is input into the input terminal of the DUT 300. The control section 160 determines the settings for the first and second calculating sections 50 and 60 based on the waveform of the reference signal measured by the reference measuring section 170. In detail, the control section 160 may set the signs selected by the sign control circuits 52 and 62, and set the weight coefficients for the calculating circuits 54 and 64. Furthermore, the control section 160 may set the phases of the periodic signals output from the timing generators 12.

Figure 12:
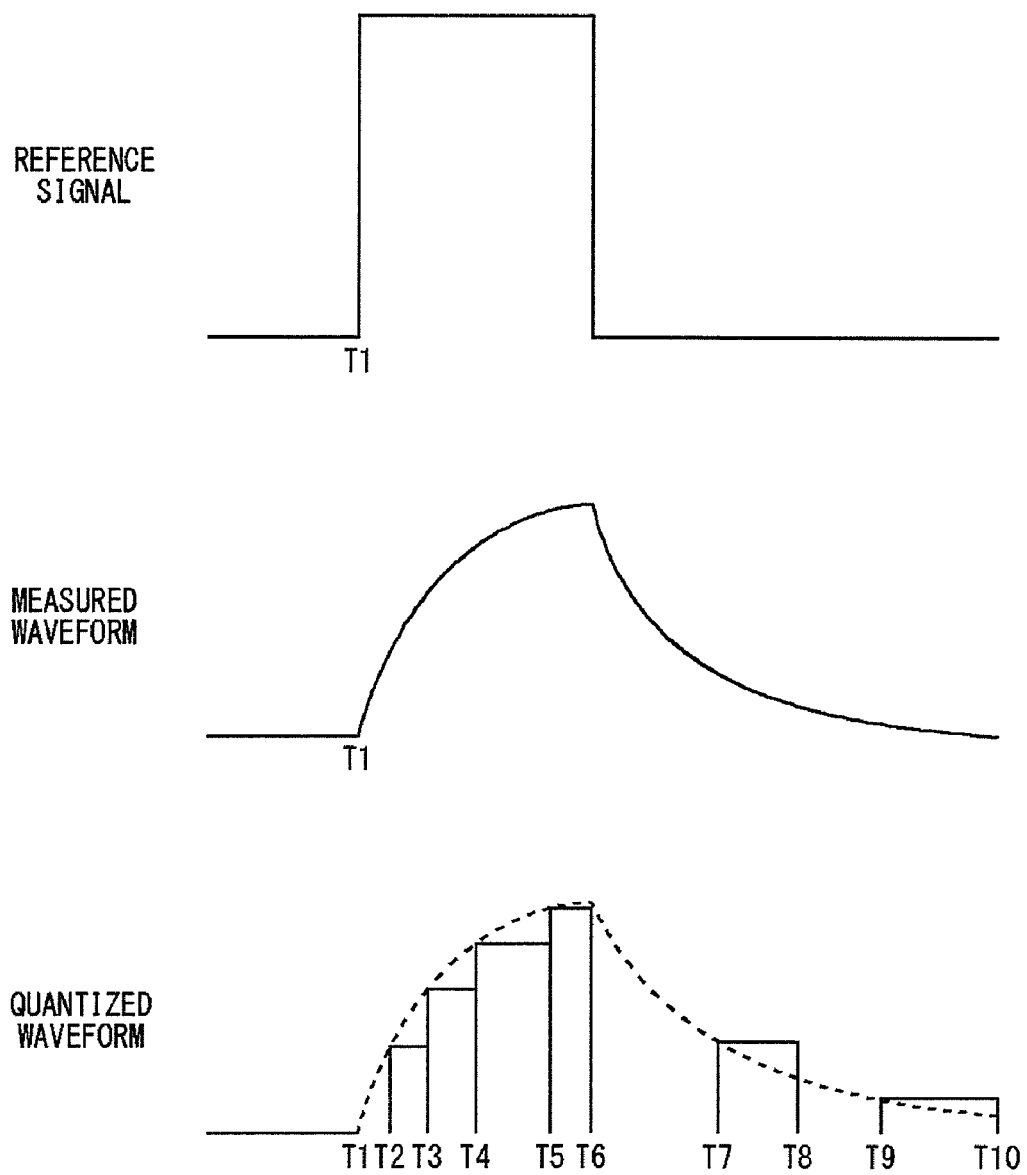
FIG. 12 shows an operation performed by a calibrating section 180 as an example.

FIG. 12 shows the operation performed by the calibrating section 180 as an example. As mentioned above, the reference generating section 150 causes the signal generating apparatus 100 to output a predetermined reference signal, and the reference measuring section 170 measures the waveform of the reference signal at a point when the reference signal is input into the input terminal of the DUT 300.

The control section 160 quantizes the waveform measured by the reference measuring section 170 as shown in FIG. 12. Based on the quantized waveform, the control section 160 then detects attenuation and the like of the reference signal which may have occurred on the transmission path 140, and calibrates the signal generating apparatus 100 based on the detection result.

For example, the control section 160 approximates the quantized waveform by a plurality of pulses. By using the phases and pulse widths of the pulses, the control section 160 may control the phases of the periodic signals output from the timing generators 12. Also, the control section 160 may control the weight coefficients for the calculating circuits 54 and 64 based on the levels of the rectangular waves. In addition, the control section 160 may compare the waveform of the reference signal with the quantized waveform, in order to judge whether to superimpose or reduce the components of the rectangular waves of the quantized waveform on/from the reference signal in advance. Based on the judgment, the control section 160 may control the signs to be selected by the sign control circuits 52 and 62.

According to the above description with reference to FIGS. 1 to 12, the signal generating apparatus 100 corrects the waveform of the output signal in advance to compensate the attenuation, reflection or the like that may occur on the transmission path 140. Additionally, the signal generating apparatus 100 has a different function. For example, the signal generating apparatus 100 may degrade the waveform of the output signal, and input the resulting signal into the DUT 300. This can detect the maximum level of degradation in the waveform of the output signal which allows the DUT 300 to operate normally.

Figure 13:
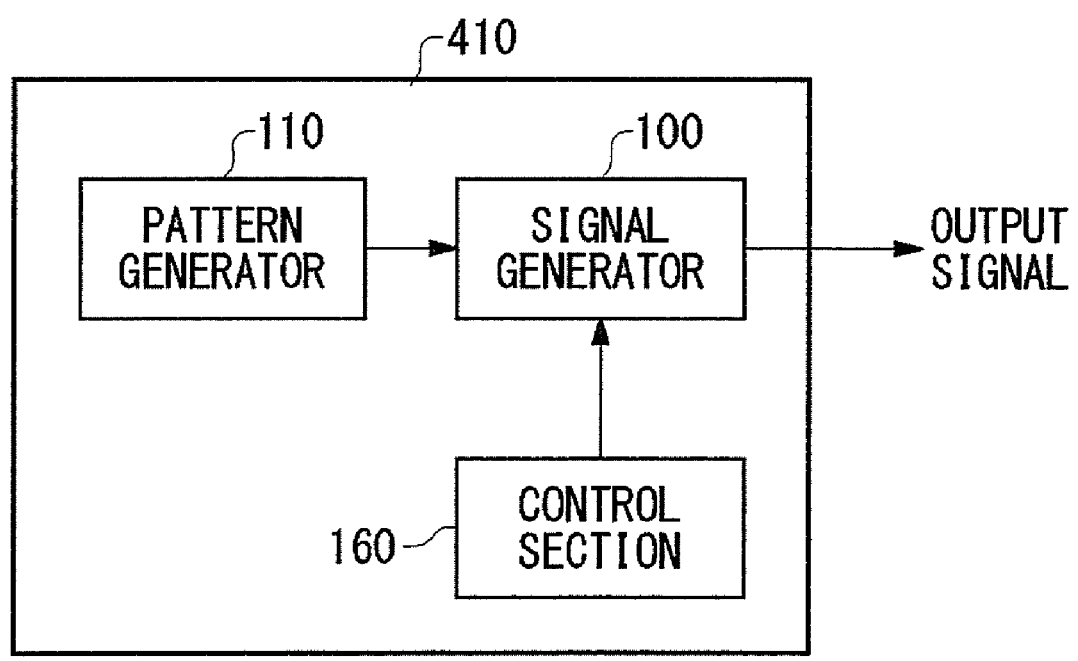
FIG. 13 shows an exemplary configuration of a circuit device 400 relating to another embodiment of the invention.

FIG. 13 shows an exemplary configuration of a circuit device 400 relating to another embodiment of the invention. The circuit device 400 may include a semiconductor circuit, for example. The circuit device 400 includes a substrate 410, the pattern generator 110, the signal generating apparatus 100, and the control section 160. The substrate 410 may be a semiconductor substrate, for example. The signal generating apparatus 100, pattern generator 110, and control section 160 may be circuits formed in the substrate 410.

The signal generating apparatus 100, pattern generator 110, and control section 160 have the same or similar configurations and functions as/to the constituents identified by the same reference numerals in FIGS. 1 to 12. In this embodiment, the control section 160 may prestore therein information relating to the settings of the signal generating apparatus 100 such as the signs, weight coefficients and phases of the periodic signals. Alternatively, the control section 160 may adjust the signal generating apparatus 100 based on settings data provided from outside. Having the above-described configuration, the circuit device 400 can output a signal having a desired waveform.

Although some aspects of the present invention have been described by way of exemplary embodiments, it should be understood that those skilled in the art might make many changes and substitutions without departing from the spirit and the scope of the present invention which is defined only by the appended claims.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

As clearly indicated above, some exemplary embodiments of the present invention can realize a signal generating apparatus that can correct the waveform of an output signal based on a desired phase. In addition, the embodiments of the present invention can realize a test apparatus that can accurately test a DUT.

What is claimed is:

1. A signal generating apparatus for generating an output signal corresponding to pattern data supplied thereto, the signal generating apparatus comprising:
    a timing generating section that generates a periodic signal;
    a shift register section including a plurality of flip-flops in a cascade arrangement through which each piece of data of the pattern data is propagated sequentially in response to the periodic signal;
    a waveform generating section that generates the output signal whose value varies in accordance with a cycle of the periodic signal, based on data values output from the plurality of flip-flops, wherein the waveform of the output signal is in units of unit interval; and
    an analog circuit that enhances a predetermined frequency component in the waveform of the output signal generated by the waveform generating section so as to output an analog signal whose value varies at an interval smaller than the unit interval.

2. The signal generating apparatus according to claim 1, wherein the timing generating section generates the periodic signal that has the same cycle as the output signal to be generated by the signal generating apparatus.

3. The signal generating apparatus according to claim 1, wherein
    the analog circuit includes at least one RC high pass filter provided in parallel with a transmission line of the output signal, and
    the analog circuit enhances the predetermined frequency component in the waveform of the output signal by combining a signal from the at least one high pass filter and a signal from the transmission line.

4. A signal generating apparatus for generating an output signal corresponding to pattern data supplied thereto, the signal generating apparatus comprising:
    a timing generating section that generates a periodic signal;
    a shift register section including a plurality of flip-flops in a cascade arrangement through which each piece of data of the pattern data is propagated sequentially in response to the periodic signal;
    a waveform generating section that generates the output signal whose value varies in accordance with a cycle of the periodic signal, based on data values output from the plurality of flip-flops; and
    an analog circuit that enhances a predetermined frequency component in a waveform of the output signal generated by the waveform generating section, wherein
    the timing generating section includes:
        a first timing generator that generates a first periodic signal and supplies the generated first periodic signal to the shift register section; and
        a second timing generator that generates a second periodic signal that has the same cycle as the first periodic signal and has a different phase from the first periodic signal, and
    the signal generating apparatus further comprises a register that sequentially acquires data output from a pre-selected one of the plurality of flip-flops in accordance with the second periodic signal output from the second timing generator and outputs the acquired data, and
    the waveform generating section generates the output signal whose value varies in accordance with the phases of the first and second periodic signals, based on data values output from the plurality of flip-flops and the register.

5. The signal generating apparatus according to claim 4, further comprising a tap control section that selects a data value output from one of the plurality of flip-flops and inputs the selected data value into the register.

6. A test apparatus for testing a device under test, comprising:
    a pattern generator that generates a test pattern to test the device;
    a signal generating apparatus that generates a test signal to be input into the device, based on the test pattern; and
    a judging section that judges whether the device is good or bad based on a signal output from the device,
    the signal generating apparatus including:
        a timing generating section that generates a periodic signal;
        a shift register section including a plurality of flip-flops in a cascade arrangement through which each piece of data of the test pattern is propagated sequentially in response to the periodic signal;
        a waveform generating section that generates the test signal whose value varies in accordance with a cycle of the periodic signal, based on data values output from the plurality of flip-flops; and
        an analog circuit that enhances a predetermined frequency component in a waveform of the test signal generated by the waveform generating section.

7. The test apparatus according to claim 6, wherein the timing generating section generates the periodic signal that has the same cycle as the output signal to be generated by the signal generating apparatus.

8. The test apparatus according to claim 6, wherein
    the timing generating section includes:
        a first timing generator that generates a first periodic signal and supplies the generated first periodic signal to the shift register section; and
        a second timing generator that generates a second periodic signal that has the same cycle as the first periodic signal and has a different phase from the first periodic signal, and
    the signal generating apparatus further comprises a register that sequentially acquires data output from a pre-selected one of the plurality of flip-flops in accordance with the second periodic signal output from the second timing generator and outputs the acquired data, and
    the waveform generating section generates the output signal whose value varies in accordance with the phases of the first and second periodic signals, based on data values output from the plurality of flip-flops and the register.

9. The test apparatus according to claim 8, further comprising a tap control section that selects a data value output from one of the plurality of flip-flops and inputs the selected data value into the register.

10. The test apparatus according to claim 6, wherein
    the waveform of the output signal generated by the waveform generating section is in units of unit interval, and the analog circuit enhances the predetermined frequency component in the waveform of the output signal generated by the waveform generating section so as to output an analog signal whose value varies at an interval smaller than the unit interval.

11. The test apparatus according to claim 6, wherein
the analog circuit includes at least one RC high pass filter provided in parallel with a transmission line of the output signal, and
the analog circuit enhances the predetermined frequency component in the waveform of the output signal by combining a signal from the at least one high pass filter and a signal from the transmission line.

12. A circuit device for outputting a signal having a desired waveform, comprising:
a pattern generator that generates a waveform pattern for the signal to be output from the circuit device; and
a signal generating apparatus that generates the output signal based on the waveform pattern,
the signal generating apparatus including:
a timing generating section that generates a periodic signal;
a shift register section including a plurality of flip-flops in a cascade arrangement through which each piece of data of the waveform pattern is propagated sequentially in response to the periodic signal;
a waveform generating section that generates the output signal whose value varies in accordance with a cycle of the periodic signal, based on data values output from the plurality of flip-flops; and
an analog circuit that enhances a predetermined frequency component in a waveform of the output signal generated by the waveform generating section.

13. The circuit device according to claim 12, wherein the timing generating section generates the periodic signal that has the same cycle as the output signal to be generated by the signal generating apparatus.

14. The circuit device according to claim 12, wherein
the timing generating section includes:
a first timing generator that generates a first periodic signal and supplies the generated first periodic signal to the shift register section; and
a second timing generator that generates a second periodic signal that has the same cycle as the first periodic signal and has a different phase from the first periodic signal, and
the signal generating apparatus further comprises a register that sequentially acquires data output from a pre-selected one of the plurality of flip-flops in accordance with the second periodic signal output from the second timing generator and outputs the acquired data, and
the waveform generating section generates the output signal whose value varies in accordance with the phases of the first and second periodic signals, based on data values output from the plurality of flip-flops and the register.

15. The circuit device according to claim 14, further comprising a tap control section that selects a data value output from one of the plurality of flip-flops and inputs the selected data value into the register.

16. The circuit device according to claim 12, wherein
the waveform of the output signal generated by the waveform generating section is in units of unit interval, and
the analog circuit enhances the predetermined frequency component in the waveform of the output signal generated by the waveform generating section so as to output an analog signal whose value varies at an interval smaller than the unit interval.

17. The circuit device according to claim 12, wherein
the analog circuit includes at least one RC high pass filter provided in parallel with a transmission line of the output signal, and
the analog circuit enhances the predetermined frequency component in the waveform of the output signal by combining a signal from the at least one high pass filter and a signal from the transmission line.

* * * * *